United States Patent
Uno et al.

(10) Patent No.: US 9,437,754 B2
(45) Date of Patent: Sep. 6, 2016

(54) METHOD OF MANUFACTURING ELECTRICAL DEVICE

(71) Applicant: E I DU PONT DE NEMOURS AND COMPANY, Wilmington, DE (US)

(72) Inventors: Hikaru Uno, Kanagawa (JP); John Donald Summers, Chapel Hill, NC (US); Esther Kim, Cary, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/936,654

(22) Filed: Nov. 9, 2015

(65) Prior Publication Data

US 2016/0133764 A1   May 12, 2016

Related U.S. Application Data

(60) Provisional application No. 62/152,143, filed on Apr. 24, 2015, provisional application No. 62/077,636, filed on Nov. 10, 2014.

(51) Int. Cl.
*H01L 31/0224* (2006.01)

(52) U.S. Cl.
CPC .............................. *H01L 31/022425* (2013.01)

(58) Field of Classification Search
CPC ............ H01L 21/02332; H01L 21/0228; H01L 21/02123; H01L 21/02642; H01L 21/02178; H01L 21/0262; H01L 31/0224; H01L 31/022425; H01L 51/0634; H01L 51/525

USPC ............ 438/82, 98, 99, 660, 680, 681, 753, 438/756, 757; 257/746, 759, 745, 760, 257/E21.006, E21.007, E21.077, E21.126, 257/E21.127, E21.17, E21.053, E21.267, 257/E21.278, E21.293, E21.352
See application file for complete search history.

(56) References Cited

U.S. PATENT DOCUMENTS

| | | | |
|---|---|---|---|
| 5,783,657 A * | 7/1998 | Pavlin | A61K 8/042 528/310 |
| 6,399,713 B1 * | 6/2002 | MacQueen | A61K 8/042 525/408 |
| 6,956,099 B2 | 10/2005 | Pavlin | |
| 8,389,324 B2 * | 3/2013 | Konno | H01B 1/22 438/98 |
| 2009/0298283 A1 * | 12/2009 | Akimoto | C03C 8/10 438/660 |
| 2010/0301479 A1 * | 12/2010 | Yang | C09D 11/52 257/746 |
| 2013/0011959 A1 | 1/2013 | Konno | |

* cited by examiner

*Primary Examiner* — David Nhu

(57) ABSTRACT

A method of manufacturing an electrical device comprising steps of: preparing a substrate; applying a conductive paste onto the substrate, wherein the conductive paste comprises (i) an inorganic powder comprising at least a conductive powder, (ii) an organic polymer, (iii) a solvent and (iv) a gellant selected from the group consisting of a polyalkyleneoxy terminated polyamide (PAOPA), an ester terminated polyamide (ETPA), polyether polyamine (PEPA) and a mixture thereof; and heating the applied conductive paste to form an electrode.

19 Claims, 1 Drawing Sheet

METHOD OF MANUFACTURING ELECTRICAL DEVICE

FIELD OF THE INVENTION

The invention relates to an electrical device, more specifically to a method of manufacturing an electrode that the electrical device contains.

TECHNICAL BACKGROUND OF THE INVENTION

An electrical device such as a solar cell is required to have a fine line electrode.

US2013011959 discloses a method of manufacturing a solar cell electrode comprising steps of: applying onto a semiconductor substrate a conductive paste comprising (i) a conductive powder, (ii) a glass frit, (iii) ethyl cellulose as an organic polymer and (iv) a solvent comprising 30 to 85 weight percent (wt %) of 1-phenoxy-2-propanol based on the weight of the solvent; and firing the conductive paste.

SUMMARY OF THE INVENTION

An objective is to provide a method of manufacturing an electrical device comprising a fine line electrode.

An aspect relates to A method of manufacturing an electrical device comprising steps of: preparing a substrate; applying a conductive paste onto the substrate, wherein the conductive paste comprises (i) an inorganic powder comprising at least a conductive powder, (ii) an organic polymer, (iii) a solvent and (iv) a gellant selected from the group consisting of a polyalkyleneoxy terminated polyamide (PAOPA), an ester terminated polyamide (ETPA), polyether polyamine (PEPA) and a mixture thereof; and heating the applied conductive paste to form an electrode.

Another aspect relates to a conductive paste comprising: (i) an inorganic powder comprising at least a conductive powder; (ii) an organic polymer; (iii) a solvent; and (iv) a gellant selected from the group consisting of a polyalkyleneoxy terminated polyamide (PAOPA), ester terminated polyamide (ETPA), polyether polyamine (PEPA) and a mixture thereof.

Another aspect relates to a conductive paste comprising: (i) an inorganic powder comprising at least a conductive powder; (ii) an organic polymer; (iii) a solvent; and (iv) a gellant having a molecular weight of 1,000 to 100,000.

An electrical device having a fine line electrode can be provided by the present invention.

DETAILED DESCRIPTION OF THE INVENTION (Method of Manufacturing an Electrical Device)

The method of manufacturing an electrical device comprising steps of: preparing a substrate, applying a conductive paste onto the substrate, and heating the applied conductive paste to form an electrode.

There is no limitation on the electrical device. The electrical device can be a circuit board, a LED device, a display panel or a solar cell in an embodiment. The substrate can be glass substrate, polymer film substrate or semiconductor substrate.

Any method can be available for applying the conductive paste on the substrate as long as the fine pattern can be formed. The applying method can be screen printing, transfer printing, nozzle discharge in an embodiment.

The heating condition can be determined in order to cure or harden the conductive paste which is a viscos composition. During heating the organic materials in the conductive paste can be cured or evaporated. The heating peak temperature is 200 to 1000° C. in another embodiment, 220 to 950° C. in another embodiment. The heating peak temperature is 200 to 400° C. in another embodiment, 220 to 350° C. in another embodiment. Heating temperature can be selected for example depending on the type of the conductive paste cure-type or fire-type. The heating peak temperature is 500 to 950° C. in another embodiment, 600 to 900° C. in another embodiment, 700 to 880° C. in another embodiment.

The following shows an embodiment of manufacturing process in the event of a solar cell as an electrical device. However, the invention is not limited to the following embodiment. The method is available for other types of solar cells and other electrical devices such as printed circuit boards, optical devices and display panels.

Figure 1A:
FIG. 1A to 1F are drawings for explaining a solar cell electrode manufacturing process.

FIG. 1A shows a p-type silicon substrate 10 as a semiconductor substrate. The semiconductor substrate for solar cell can be a mono-crystal silicon substrate or a multi-crystal silicon substrate in an embodiment.

Figure 1B:
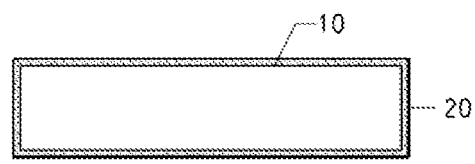

In FIG. 1B, an n-layer 20, of the reverse conductivity type is formed by the thermal diffusion of phosphorus (P) or the like. Phosphorus oxychloride ($POCl_3$) is commonly used as the phosphorus diffusion source. In the absence of any particular modification, n-layer 20 is formed over the entire surface of the silicon substrate 10. The silicon wafer consists of p-type substrate 10 and n-layer 20 typically has a sheet resistivity on the order of several tens of ohms per square (ohm/□).

Any type of substrate can be selected for other electrical devices. The substrate is a ceramic substrate, glass substrate, polymer film substrate or semiconductor substrate in another embodiment.

Figure 1C:
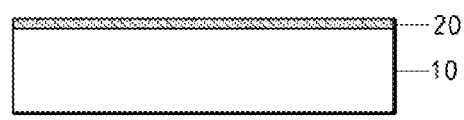

After protecting one surface of the n-layer with a resist or the like, the n-layer 20 is removed from most surfaces by etching so that it remains only on one main surface as shown in FIG. 1C. The resist is then removed using a solvent or the like.

Figure 1D:
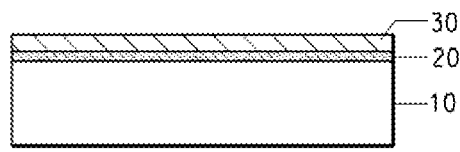

Next, a passivation layer can be formed on the light receiving side of the semiconductor substrate. The passivation layer 30 is formed on the surface of the n-layer 20 as shown in FIG. 1D in an embodiment. The passivation layer can be formed by a process such as plasma chemical vapor deposition (CVD). $SiN_x$, $TiO_2$, $Al_2O_3$, $SiO_x$ or ITO could be used as a material for a passivation layer. Most commonly used is $Si_3N_4$. The passivation layer is sometimes called anti-reflection layer, especially when it is formed on the front side that is the light receiving side of the semiconductor substrate.

Figure 1E:
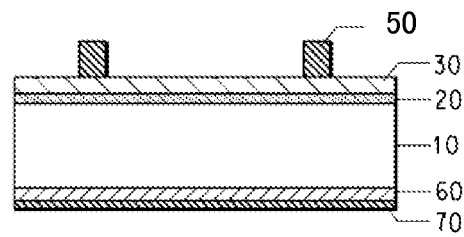

As shown in FIG. 1E, conductive paste, 50, for a front electrode is applied on the passivation layer, 30, formed on the silicon substrate and then dried. In an embodiment the front electrode is applied by screen print the conductive paste through a screen mask. An aluminum paste, 60, and a silver paste, 70, are screen printed onto the back side of the substrate, 10, and successively heated at 60 to 300° C. to dry the printed paste.

The viscosity of the conductive paste, 50, is 330 to 550 Pa·s at 25° C. in an embodiment, 350 to 520 Pa·s at 25° C. in another embodiment, 420 to 500 Pa·s at 25° C. in another embodiment. The viscosity of the conductive paste, 50, can be measured with Brookfield HBT viscometer with a utility cup using a #14 spindle.

The electrode is formed by heating the printed conductive paste. In an embodiment, heating is carried out in an infrared furnace at a peak temperature in a range of 450 to 1000° C. This heating can be called firing.

Heating total time from an entrance to an exit of the furnace can be from 30 seconds to 5 minutes in an embodiment. With such heating condition, a semiconductor substrate can get less damage from the heat. In an embodiment, the heating profile can be 10 to 60 seconds at over 400° C. and 2 to 10 seconds at over 600° C.

Figure 1F:
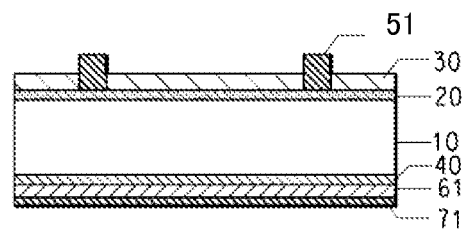

As shown in FIG. 1F, during firing, aluminum diffuses as an impurity from the aluminum paste into the silicon substrate, 10, on the back side, thereby forming a $p^+$ layer, 40, containing a high aluminum dopant concentration. Firing converts the dried aluminum paste, 60, to an aluminum back electrode, 61. The backside silver paste, 70, is fired at the same time, becoming a silver back electrode, 71. During firing, the boundary between the backside aluminum and the backside silver assumes the state of an alloy, thereby achieving electrical connection. Most areas of the back electrode are occupied by the aluminum electrode, partly on account of the need to form a $p^+$ layer, 40 in an embodiment. At the same time, because soldering to an aluminum electrode is not easy, the silver paste, 70, is used to form a backside electrode, 71, on limited areas of the backside as an electrode for interconnecting solar cell cells by means of copper ribbon or the like in an embodiment.

On the front side, the front electrode, 51, is made of the conductive paste, 50, which is capable of firing through the passivation layer, 30, during firing to achieve electrical contact with the n-type layer, 20. The front electrode 51 can comprise at least finger lines and a bus bar in an embodiment. The present invention can be used to form at least the finger lines that are required to be narrow wide in an embodiment. The width of the electrode can be 10 to 45 μm in an embodiment, 20 to 43 μm in another embodiment, 30 to 41 μm in another embodiment.

Although a p-base type of solar cell is shown as an example, the present invention can be available for an n-base type of solar cell or any other type of a solar cell using a conductive paste.

When the electrode is of a heat-curable type, the printed conductive paste is heated to a relatively lower temperature and the conductive paste is thereby cured to become an electrode. The heating temperature can be 100 to 300° C. in an embodiment, 120 to 250° C. in another embodiment, 150 to 220° C. in another embodiment. The heating time can be 10 to 90 minutes in an embodiment, 15 to 70 minutes in another embodiment, and 20 to 45 minutes in another embodiment. The heating temperature is adjustable in consideration of the heating time such as low temperature for long time and high temperature for short time.

The width of the heat-curable type electrode can be 11 to 47 μm in an embodiment, 21 to 46 μm in another embodiment, 31 to 45 μm in another embodiment.

The aspect ratio (height/width) of the electrode can be greater than 0.25 in an embodiment, greater than 0.3 in another embodiment.

(Conductive Paste)

A conductive paste to form the electrode is explained in detail below. The conductive paste comprises (i) an inorganic powder comprising at least a conductive powder, (ii) an organic polymer, (iii) a solvent and (iv) a gellant comprising a polyalkyleneoxy terminated polyamide (PAOPA).

(i) Inorganic Powder

The inorganic powder comprises at least a conductive power. The conductive powder is a metal powder to transport electrical current in the electrode.

In an embodiment, a conductive powder is a metal powder with an electrical conductivity $1.00 \times 10^7$ Siemens (S)/m or more at 293 Kelvin. Such conductive metals may comprise, for example, iron (Fe; $1.00 \times 10^7$ S/m), aluminum (Al; $3.64 \times 10^7$ S/m), nickel (Ni; $1.45 \times 10^7$ S/m), copper (Cu; $5.81 \times 10^7$ S/m), silver (Ag; $6.17 \times 10^7$ S/m), gold (Au; $4.17 \times 10^7$ S/m), molybdenum (Mo; $2.10 \times 10^7$ S/m), magnesium (Mg; $2.30 \times 10^7$ S/m), tungsten (W; $1.82 \times 10^7$ S/m), cobalt (Co; $1.46 \times 10^7$ S/m) and zinc (Zn; $1.64 \times 10^7$ S/m).

In another embodiment, a conductive powder can be a metal powder with an electrical conductivity $3.00 \times 10^7$ S/m or more at 293° Kelvin. In this case, the conductive powder can comprise one or more metal powder(s) selected from the group consisting of Al, Cu, Ag and Au. In another embodiment, the conductive powder can comprise Ag powder, Al powder or a mixture thereof. In an embodiment, the conductive powder can comprise Ag powder. Using such conductive metal powders with high electrical conductivity, the electrical property of an electrode can be improved.

In an embodiment, a conductive powder is flaky or spherical in shape.

There is no special restriction on particle diameter of the conductive powder from a viewpoint of technological effectiveness when used as typical electrically conducting paste. In an embodiment, however, particle diameter of the conductive powder can be 0.01 to 10 μm, in another embodiment 0.3 to 5 μm, in another embodiment 0.8 to 3 μm. With such particle diameter, the conductive powder can be sintered well. For example, large particles can be sintered more slowly than small particles. Furthermore, it can be also necessary that the particle diameter can be appropriate for a method used to apply the conductive paste onto a semiconductor substrate, for example, screen printing. In an embodiment, it is possible to mix two or more types of conductive powder of different diameters.

The particle diameter (D50) is obtained by measuring the distribution of the particle diameters by using a laser diffraction scattering method and can be defined as D50. Microtrac model X-100 is an example of the commercially-available devices.

In an embodiment, the conductive powder is of ordinary high purity (99%). However, depending on the electrical requirements of the electrode pattern, less pure conductive powders can also be used.

There are no special restrictions on the content of the conductive powder, however, in an embodiment, the conductive powder is 40 weight percent (wt %) or more, in another embodiment 60 wt % or more, in another embodiment 75 wt % or more based on the total weight of the conductive paste, in view of conductivity. For the maximum conductive metal content, the conductive powder can be 95 wt % or less in another embodiment, 92 wt % or less in another embodiment, 90 wt % or less in another embodiment based on the total weight of the conductive paste, depending on the powder's dispersibility.

The inorganic powder optionally further comprises a glass frit. Especially when forming an electrode by firing a conductive paste, a glass frit melts to promote sintering the conductive powder, and adhere the electrode to the substrate.

Particle diameter of the glass frit can be 0.1 to 7 μm in an embodiment, 0.3 to 5 μm in another embodiment, 0.4 to 3 μm in another embodiment, 0.5 to 1 μm in another embodiment. With such particle diameter, the glass frit can be uniformly dispersed in the paste. The particle diameter (D50) is obtained in the same manner as described above for the conductive powder.

In an embodiment, softening point of a glass frit can be 390 to 600° C., in another embodiment 400 to 550° C., in another embodiment, 410 to 460° C. When the softening point is in the range, glass frit can melt properly to obtain the effects mentioned above. The softening point of a glass frit can be obtained by the fiber elongation method of ASTM C338-57.

The chemical composition of the glass frit here is not limited. Any glass frits suitable for use in electrically conducting pastes for electronic materials are acceptable. For example, lead borosilicate glass frits can be used. Lead silicate, lead boronsilicate, lead tellurium glasses can be excellent from a viewpoint of both softening point and glass fusion characteristics. In addition, zinc borosilicate or lead-free glasses can be also used.

The glass frit can be Pb—B—Si glass, Pb—Si—Al glass, Pb—Te—B glass, Pb—Te—Li glass, Pb—V glass, Bi—Si—B glass, Bi—Te glass or a mixture thereof in an embodiment.

Pb—B—Si glass can comprise 50 to 70 wt % of PbO, 25 to 30 wt % of $SiO_2$ and 5 to 20 wt % of $B_2O_3$ based on the weight of the Pb—B—Si glass in an embodiment.

A Pb—Si—Al glass can comprise 65 to 90 wt % of PbO, 9 to 30 wt % of $SiO_2$ and 0.1 to 5 wt % of $Al_2O_3$ based on the weight of the Pb—Si—Al glass in an embodiment.

A Pb—Te—Li glass can comprise 25 to 70 wt % of PbO, 25 to 70 wt % of $TeO_2$ and 0.1 to 5 wt % of $Li_2O$ based on the weight of the Pb—Te—Li glass in an embodiment.

A Pb—V glass can comprise 50 to 80 wt % of PbO and 10 to 45 wt % of $V_2O_5$ based on the weight of the Pb—V glass in an embodiment.

A Bi—Si—B glass can comprise 50 to 90 wt % of $Bi_2O_3$, 5 to 25 wt % of $SiO_2$ and 0.1 to 5 wt % of $B_2O_3$ based on the weight of the Bi—Si—B glass in an embodiment.

A Bi—Te glass can comprise 22 to 42 wt % of $Bi_2O_3$ and 50 to 78 wt % of $TeO_2$ based on the weight of the Bi—Te glass in an embodiment.

The amount of the glass frit can be determined based on the amount of the conductive powder. The weight ratio of the conductive powder and the glass frit (conductive powder: glass frit) can be 10:1 to 100:1 in an embodiment, 25:1 to 80:1 in another embodiment, 30:1 to 68:1 in another embodiment, 42:1 to 53:1 in another embodiment. With such amount of the glass frit, sintering a conductive powder and adhesion between an electrode and a substrate can be sufficient.

In an embodiment, the glass frit can be 0.5 to 8 wt %, in another embodiment 0.8 to 6 wt %, in another embodiment 1.0 to 3 wt % based on the total weight of the conductive paste.

The inorganic additive comprises an inorganic additive such as a metal oxide compound in an embodiment. The inorganic additive can be a cobalt oxide compound, an iron oxide compound, a chromium oxide compound, an aluminum oxide compound, a zirconium oxide compound, a zinc oxide compound, a lithium oxide compound, a silicon oxide compound, a lead oxide compound or a titanium oxide compound. The inorganic additive is 0.01 to 1 wt % in an embodiment, 0.03 to 0.5 wt % in another embodiment based on the total weight of the conductive paste.

(ii) Organic Polymer

The conductive paste comprises an organic polymer as organic binder.

In the event of heating the applied conductive paste at high temperature for example 450° C. or higher, the organic polymer could burn out during heating. There is no restriction on the type of polymer resin. The organic polymer can comprise epoxy resin, polyester resin, ethylene-vinyl acetate copolymer, ethyl cellulose, acrylic resin or a mixture thereof in an embodiment.

In the event of forming a heat-curable electrode, the polymer can be thermosetting in an embodiment. The thermosetting polymer can be phenolic resin, urea resin, melamine resin, epoxy resin, unsaturated polyester resin, silicone resin, polyurethane resin, polyvinyl butyral resin, polyimide resin, acrylic resin or a mixture thereof in an embodiment.

The organic polymer can be 0.01 to 5.0 parts by weight in an embodiment, 0.02 to 3.0 parts by weight in another embodiment, 0.03 to 2.0 parts by weight in another embodiment when the inorganic powder is 100 parts by weight. The conductive paste can have a sufficient viscosity with such amount of the organic polymer.

The organic polymer can be 0.01 to 5 wt %, in another embodiment 0.03 to 2.5 wt %, in another embodiment 0.05 to 1 wt % based on the total weight of the conductive paste.

(iii) Solvent

The conductive paste comprises a solvent as a medium to disperse the inorganic powder. A solvent can be any liquid that dissolves the organic polymer.

In an embodiment, the solvent can be selected from the group consisting of butyl carbitol acetate, dibasic ester (DBE), terpineol, texanol and a mixture thereof. DBE can be obtained from INVISTA Inc. as DBE-2, DBE-3, DBE-4, DBE-5, DBE-6, DBE-9 or DBE-IB.

The solvent can be 1 to 100 parts by weight in an embodiment, 2 to 50 parts by weight in another embodiment, 3 to 30 parts by weight in another embodiment, 5 to 20 parts by weight in another embodiment when the inorganic powder is 100 parts by weight.

The solvent can be 3.0 to 40.0 wt % in an embodiment, 4.0 to 30.0 wt % in another embodiment, 5.0 to 20.0 wt % in another embodiment, 5.0 to 10.0 wt % in another embodiment, based on the weight of the conductive paste. With such amount of solvent, a conductive paste could obtain sufficient viscosity for printability.

(iv) Gellant

The conductive paste includes a gellant. The gellant is selected from the group consisting of a polyalkyleneoxy terminated polyamide (PAOPA), an ester terminated polyamide (ETPA), polyether polyamine (PEPA) and a mixture thereof. In another embodiment, the gellant could comprise a polyalkyleneoxy terminated polyamide (PAOPA). In another embodiment, the gellant could comprise an ester terminated polyamide (ETPA). The gellant could comprise polyether polyamine (PEPA) in another embodiment. The gellant could comprise a mixture of PAOPA, ETPA and PEPA in another embodiment.

The gellant can modify paste's rheology so that the paste can get pseudoplastic such that the paste's viscosity lowers as shear velocity increases. This pseudoplastic nature allows the paste to flow once shear is applied, and then to recover once the applied shear is removed.

Softening point of the gellant is 70 to 120° C. in an embodiment, 82 to 110° C., in another embodiment, 90 to 100° C. in another embodiment.

Molecular weight (Mw) of the gellant is 1,000 to 100,000 in an embodiment, 3,000 to 60,000 in another embodiment, 5,000 to 45,000 in another embodiment, and 9,000 to 30,000 in another embodiment.

ETPA comprises a polyamide polymer main chain and one or more of an ester group.

In an embodiment, the ETPA comprises at least one compound of formula (1):

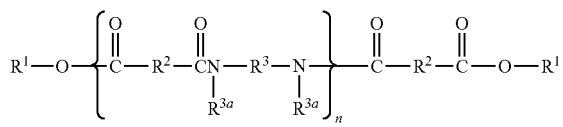

wherein n designates a number of repeating units such that ester groups constitute from 10% to 50% of the total of the ester and amide groups; $R^1$ at each occurrence is independently selected from an alkyl or alkenyl group containing at least 4 carbon atoms; $R^2$ at each occurrence is independently selected from a $C_{4-42}$ hydrocarbon group with the proviso that at least 50% of the $R^2$ groups have 30-42 carbon atoms; $R^3$ at each occurrence is independently selected from an organic group containing at least two carbon atoms in addition to hydrogen atoms, and optionally containing one or more oxygen and nitrogen atoms; and $R^{3a}$ at each occurrence is independently selected from hydrogen, $C_{1-10}$ alkyl and a direct bond to $R^3$ or another $R^{3a}$ such that the N atom to which $R^3$ and $R^{3a}$ are both bonded is part of a heterocyclic structure defined in part by $R^{3a}$—N—$R^3$, such that at least 50% of the $R^{3a}$ groups are hydrogen.

In another embodiment, the ETPA comprises at least one compound of formula (1) above, wherein n=0, such that the ratio of ester groups to the sum of ester and amide groups in the total of the ester-terminated polyamide and diester is from 0.1 to 0.7. In another embodiment, the ETPA is at reaction equilibrium.

U.S. Pat. No. 5,783,657 disclosing structures and making methods of the ETPA above can be incorporated herein by reference.

Molecular weight (Mw) of ETPA is 1,000 to 20,000 in an embodiment, 3,000 to 10,000 in another embodiment, and 5,000 to 8,000 in another embodiment.

ETPA can be obtained in the market, for example CrystaSense™ LP-1 and LP-2 from Croda International Plc.

PAOPA comprises a polyamide polymer main chain and one or more of a polyalkyleneoxy group at one or both sides of the termination of the polyamide polymer main chain. The polyalkyleneoxy group comprises a repeated structure of an alkyleneoxy unit consisting of oxygen and carbon hydride.

The polyalkyleneoxy group can be expressed as $[C_mH_{2m}O]_n$ where m is 1 to 20 and n is 2 to 400 in an embodiment. m is 1-6 in an embodiment, m is 1-4 in another embodiment and m is 1-3 in another embodiment. n is more than 3 in an embodiment, more than 5 in another embodiment, more than 10 in another embodiment, and more than 20 in another embodiment. n is less than 300 in an embodiment, less than 200 in another embodiment, less than 100 in another embodiment, less than 80 in another embodiment and less than 50 in another embodiment.

The alkyleneoxy unit can be expressed as $R_1$—O where $R_1$ is alkylene in an embodiment. $R_1$ can be ethylene, methane, ethane, propane, propylene, butylene or hexylene in another embodiment.

The polyalkyleneoxy group can comprise same alkyleneoxy units or different alkyleneoxy units.

A polyamide is a macromolecule with repeating units linked by amide bonds [—CONH—]. The polyamide can be aliphatic polyamide or aromatic polyamide in another embodiment.

The PAOPA is a resin composition containing at least one block copolymer of the formula: hydrocarbon-polyether-polyamide-polyether-hydrocarbon in another embodiment. PAOPA comprises one or more of a diacid, diamine or hydrocarbon-terminated polyether in another embodiment.

In an embodiment, the polyamide block comprises a block of formula (3):

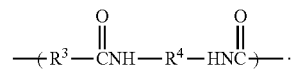

where $R^3$ is a hydrocarbon diradical, and $R^4$ is a hydrocarbon or a polyether diradical. $R^3$ is a dimer acid-derived in another embodiment. The $R^3$ comprises a diradical that results when two carboxylic acid groups are removed from dimer acid in another embodiment.

In an embodiment, the polyether block includes blocks of the formula (4):

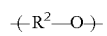

where $R^2$ is a hydrocarbon.

In an embodiment, at least one of the hydrocarbon blocks includes $C_{1-22}$ hydrocarbon radicals. The hydrocarbon radical is optionally selected from alkyl, aralkyl, aryl, and alkaryl radicals in another embodiment.

In other aspects, the PAOPA may be a composition containing at least one copolymer that has the formula (5):

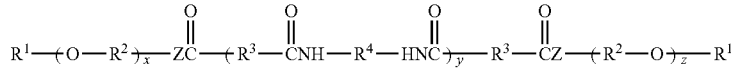

where independently at each occurrence, $R^1$ is selected from $C_{1-22}$ hydrocarbon radicals; $R^2$ is selected from $C_{2-6}$ hydrocarbon diradicals; $R^3$ is selected from $C_{2-52}$ hydrocarbon diradicals, where at least 50% of the $R^3$ diradicals have at least 34 carbons; $R^4$ is selected from $C_{2-36}$ hydrocarbon diradicals and $C_4$-$C_{100}$ polyether diradicals; Z is selected from O and NH; x is an integer from 2 to 100; y is an integer from 1 to 10.

In other aspects, the PAOPA may be a composition containing at least one copolymer that has the formula (6):

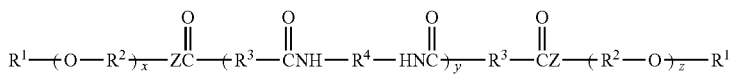

where, independently at each occurrence, $R^1$ is a $C_1$-$C_8$ hydrocarbon radical; $R^2$ is a $C_1$-$C_4$ hydrocarbon diradical; $R^3$ is a $C_1$-$C_{52}$ hydrocarbon diradical, where at least 50% of the $R^3$ diradicals are derived from dimer acid; $R^4$ is selected from $C_1$-$C_8$ hydrocarbon diradicals and polyether diradicals of the formula —$(R^{11}$—$O)_g$—$R^{11}$— wherein $R^{11}$ is a $C_1$-$C_6$ hydrocarbon diradical independently selected at each occurrence and g is an integer from 2 to 100; Z is selected from O and NH; x is an integer from 2 to 100; y is an integer equal to 1 or more that provides a copolymer molecular weight of 2,000 to 50,000, and z is an integer from 2 to 100.

In other aspects, the PAOPA may be a composition containing at least one copolymer that has the formula (7):

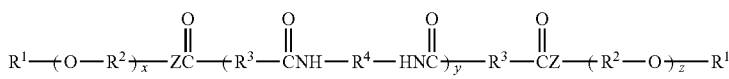

where $R^1$ is $CH_3$; $R^2$ is a $C_2$-$C_4$ hydrocarbon diradical; $R^3$ is derived entirely from dimer acid; $R^4$ is selected from $C_2$-$C_6$ hydrocarbon diradicals and polyether diradicals of the formula: —$(R^{11}$—$O)_g$—$R^{11}$—, wherein $R^{11}$ is a $C_2$-$C_4$ hydrocarbon diradical (independently selected at each occurrence) and g is an integer from 4 to 50; Z is —NH; x and z are integers from 20 to 50; and y is an integer that is >2.

In another embodiment, the PAOPA comprises a copolymer as described above, that meets one or more of the following criteria: an acid number of less than 25; an amine number of less than 5; a softening point of 50-150° C.; a weight average molecular weight of 2,000 to 20,000; a melting point above 50° C. and a viscosity at 160° C. of less than 5,000 cps.

U.S. Pat. No. 6,399,713 disclosing structures and making methods of the PAOPA above can be incorporated herein by reference.

Molecular weight (Mw) of PAOPA is 5,000 to 50,000 in an embodiment, 8,000 to 40,000 in another embodiment, 10,000 to 32,000 in another embodiment, and 15,000 to 25,000 in another embodiment.

PAOPA can be obtained in the market, for example CrystaSense™ MP and HP5 from Croda International Plc.

PEPA has a softening point between 60 and 180° C. in an embodiment. PEPA comprises at least two of ether binding and at least two of amino group. PEPA is formed from a reaction mixture of one or more diacid compound(s) containing 1,4-cyclohexane dicarboxylic acid (CHDA), and one or more diamine compound(s) containing poly(alkyleneoxy) diamine (PAODA) in another embodiment. The reaction mixture contains some or no monofunctional compounds reactive with either amine and/or carboxylic acid groups in another embodiment.

Further examples of PEPA is derived from a reaction mixture containing one or more diacid compound(s) including polymerized fatty acid, and at least two diamine compound(s) including poly(alkyleneoxy) diamine (PAODA) and short-chain aliphatic diamine having 2-6 carbons (SDA).

The reaction mixture contains x grams of PAODA and y grams of SDA, and x/(x+y) is 0.80-0.98; the reaction mixture weighs z grams, and x/z is at least 0.25 in an embodiment. The reaction mixture contains either no co-diacid or a minor amount of co-diacid in an embodiment. If the reaction mixture comprises a minor amount of co-diacid, then acid equivalents from co-diacid contribute less than 25% of the total acid equivalents present in the reaction mixture in another embodiment.

PEPA comprises a polyamide-polyether block copolymer in another embodiment. The a polyamide-polyether block copolymer is derived from a reaction mixture containing two or more diacid compounds containing 1,4-cyclohexane dicarboxylic acid (CHDA) and two or more diamine compounds containing poly(alkyleneoxy) diamine (PAODA) in another embodiment. The reaction mixture further comprises a monofunctional compound reactive with amine groups or carboxylic acid groups, where CHDA provides at least 60% of the acid equivalents from diacid compounds; and PAODA provides at least 90% of the amine equivalents from diamine compounds in another embodiment. The a polyamide-polyether block copolymer has a softening point between 80° C. and 120° C. in an embodiment.

The polyamide-polyether block copolymer is derived from a reaction mixture of polymerized fatty acid and two or more diamine compounds containing PAODA and a short-chain aliphatic diamine (SDA) having 2-6 carbons where: for the reaction mixture of x grams of PAODA and y grams of SDA, the ratio x/(x+y) is 0.85-0.98; and for a reaction mixture weighing z grams, the ratio x/z is >0.40.

U.S. Pat. No. 6,956,099 disclosing structures and making methods of PEPA above can be incorporated herein by reference.

Molecular weight (Mw) of PEPA is 1,000 to 20,000 in an embodiment, 3,000 to 12,000 in another embodiment, and 8,000 to 10,000 in another embodiment.

PEPA can be obtained in the market, for example CrystaSense™ HP4 from Croda International Plc.

PEPA comprises a polyamide polymer main chain and one or more of an ester group.

The amount of the gellant can be determined based on the amount of the solvent. The weight ratio of the solvent and the gellant (solvent:gellant) can be 10:1 to 50:1 in an embodiment, 14:1 to 45:1 in another embodiment, 18:1 to 40:1 in another embodiment, 20:1 to 35:1 in an embodiment. The conductive paste could have adequate rheology with such amount of gellant to form a fine line pattern.

The gellant can be 0.05 to 20 parts by weight in an embodiment, 0.06 to 15 parts by weight in another embodiment, 0.07 to 10 parts by weight in another embodiment, 0.09 to 5 parts by weight in another embodiment, 0.15 to 3 parts by weight in another embodiment, 0.2 to 1 parts by weight in another embodiment when the inorganic powder is 100 parts by weight.

The gellant can be 0.05 to 15 wt % in an embodiment, 0.07 to 8 wt % in another embodiment, 0.09 to 6 wt % in another embodiment, 0.1 to 4 wt % in another embodiment, 0.15 to 1 wt % in another embodiment, 0.2 to 0.5 wt % in another embodiment, based on the weight of the conductive paste.

(v) Additives

Thickener, stabilizer, viscosity modifier, rheology agent, thixotropic agent or surfactant as additives can be added to the conductive pastes. Other common additives such as a dispersant, viscosity-adjusting agent, and so on can also be added. The amount of the additive depends on the desired characteristics of the resulting electrically conducting paste and can be chosen by people in the industry. The additives can also be added in multiple types.

EXAMPLES

The present invention is illustrated by, but is not limited to, the following examples.

Example 1 and Comparative Example 1

The conductive paste was prepared with the following materials. The amount of each material is shown in Table 1.

Conductive powder: A spherical silver powder of 2 μm particle diameter (D50)

Glass frit: A glass frit of 0.7 μm particle diameter (D50)

Organic polymer: A mixture of ethyl cellulose and acrylic resin

Solvent: A mixture of texanol, DBE-3 from INVISTA Inc. and butyl carbitol acetate Gellant: A polyalkyleneoxy terminated polyamide (PAOPA, Ts 95° C., Mw 20,000, CrystaSense® MP from Croda International Plc.).

Additive: A rheology agent, a thixotropic agent and a surfactant respectively.

The solvent and PAOPA were mixed to form a gel. The mix ratio of the solvent and PAOPA (solvent: PAOPA) was about 27:1. The organic polymer and the gel were mixed in a mixing can for 2 hours at 80° C. 100 parts by weight of the inorganic powder consisting of the Ag powder and the glass frit was added to the mixture of the organic resin and solvent and mixed for another 15 minutes to form a conductive paste.

When well mixed, the conductive paste was repeatedly passed through a 3-roll mill for at progressively increasing pressures from 0 to 400 psi. The degree of dispersion was measured by fineness of grind (FOG). A typical FOG value was adjusted to 20/10 or less. Viscosity was measured at 25° C. by Brookfield HBT viscometer with a utility cup using a #14 spindle.

The printed pattern was formed by screen printing the conductive paste obtained above onto a SiN$_x$ layer on a multi-crystal silicon semiconductor substrate (152.4 mm×152.4 mm) through a screen mask. The screen mask had a line pattern of 35 μm wide, 150 mm long, 15 μm thickness and 360 mesh count with wire diameter of 16 μm.

The printed conductive paste was heated at 150° C. for 5 minutes to dry.

The dried conductive paste was fired in a belt furnace of IR heating type (CF-7210B, Despatch industry) at peak temperature setting at 945° C. Firing time from the furnace entrance to the exit was 78 seconds. The belt speed of the furnace was 550 cpm. The fired conductive paste cooled down to be an electrode.

Width of the line pattern before firing and after firing were respectively measured by an optical microscope, micro image checker, Model A200 from Panasonic Corporation. The width was a median value of measured widths at twelve points randomly selected on the line patterns.

Aspect ratio (height/width) of the line pattern after firing was calculated from width and height. Height was measured by a confocal laser scanning microscopy, Model OPTELICS C130 from Lasertec Corporation. The height was a median value of measured height at four points randomly selected on the line patterns.

The width of the line pattern before firing and after firing was narrower in Example 1 than the electrode in Comparative Example 1. Aspect ratio was higher in Example 1 than the electrode in Comparative Example 1.

TABLE 1

| | | (parts by weight) | |
| --- | --- | --- | --- |
| | | Comparative Example 1 | Example 1 |
| Composition | Inorganic powder* | 100 | 100 |
| | Polymer | 0.09 | 0.09 |
| | Solvent | 8 | 8 |
| | Gellant/PAOPA | 0 | 0.3 |
| | Rheology agent | 0.8 | 0 |
| | Thixotropic agent | 0.7 | 0.7 |
| | Surfactant | 0.5 | 0.6 |
| Viscosity | | 310 Pa·s | 440 Pa·s |
| Line width before firing | | 48.0 μm | 42.0 μm |
| Line width after firing | | 45.5 μm | 39.0 μm |
| Aspect ratio (height/width) | | 0.25 | 0.32 |

*Weight ratio of Ag powder and glass frit was 98/2.

Example 2 and Comparative Example 2

The conductive paste was prepared in the same manner as Example 1 except for the gallant, ester terminated polyamide (ETPA, Ts 92° C., Mw 6,500, CrystaSense® LP-1 from Croda International Plc.).

The conductive paste was screen printed on a multi-crystal silicon wafer (152 mm long, 152 mm wide) using a Dynamesh 360/16 screen with 15 micron emulsion thickness and 35 micron fingers with three bus bars.

The printed paste was then dried in an IR drying furnace at a peak temperature of 350° C. followed by firing in a Despatch multi-zone furnace with the following zone settings: zone 1: 500° C., zone 2: 550° C., zone 3: 610° C., zone 4: 700° C., zone 5: 800° C., zone 9: ranged from 885° C. to 930° C.

Line dimensions were determined with a LaserTec H1200 Confocal microscope before firing and after firing. A step and repeat program was used to obtain 30 average measurements of printed line pattern dimensions across the area of the 6 inch square wafer. An overall average was calculated from the 30 individual measurements to obtain an average line dimension for that particular test condition. Aspect ratio (height/width) of the line pattern after firing was calculated from width and height. Line dimension data about the fingers are summarized in Table 2.

The line dimensions indicate reduced finger width for Example 5 increased aspect ratio.

TABLE 2

| | | (parts by weight) | |
|---|---|---|---|
| | | Comparative Example 2 | Example 2 |
| Composition | Inorganic powder* | 100 | 100 |
| | Polymer | 0.1 | 0.1 |
| | Solvent | 6.2 | 7.2 |
| | Gellant/ETPA | 0 | 0.3 |
| | Rheology agent | 0.7 | 0 |
| | Thixotropic agent | 0.6 | 0.7 |
| | Surfactant | 0.6 | 0.6 |
| Viscosity | | 310 Pa · s | 455 Pa · s |
| Line width before firing | | 52 μm | 47 μm |
| Line width after firing | | 48 μm | 42 μm |
| Aspect ratio (height/width) | | 0.23 | 0.29 |

*Weight ratio of Ag powder/glass frit/inorganic additive was 98.5/1.4/0.1

Examples 3 to 7 and Comparative Example 3

Conductive paste was prepared in the same manner as Example 2 except for the paste composition as shown in Table 3.

The conductive paste was screen printed in AMI printer using a screen design 40 μm opening and 100 finger lines. The paste was printed in 200 mm/sec printing speed and 300 mm/sec flood speed. Pastes were printed on a mono-crystal silicon wafer and a multi-crystal silicon wafer in order to evaluate line dimension on different Si wafer type and efficiency. The printed paste was subsequently dried and fired as well as Example 2.

Finger line dimension was measured in the same manner as Example 2.

Cell efficiency (%) was measured by Berger photovoltaic cell tester. The solar cells built according to the method described above were placed in a Berger photovoltaic cell tester for measuring efficiencies. The Xe Arc lamp in the PV cell tester simulated the sunlight with a known intensity and radiated the front surface of the cell. The tester used a four contact method to measure current (I) and voltage (V) at approximately 400 load resistance settings to determine the cell's I-V curve. Cell efficiency (%, Eff) was calculated from the I-V curve.

The line width in Example 3 to 7 was respectively narrower in conjunction with increase of cell efficiency than that in Comparative Example (Com. Ex.) 3.

TABLE 3

| | | | | | | | (parts by weight) |
|---|---|---|---|---|---|---|---|
| | | Ex. 3 | Ex. 4 | Ex. 5 | Ex. 6 | Ex. 7 | Com. Ex. 3 |
| Composition | Inorganic powder* | 100 | 100 | 100 | 100 | 100 | 100 |
| | Polymer | 0.1 | 0.1 | 0.1 | 0.1 | 0.1 | 0.1 |
| | Solvent | 10.0 | 8.0 | 8.2 | 8.9 | 7.0 | 6.2 |
| | Gellant/PAOPA MP | 0.3 | 0.3 | 0.3 | 0.0 | 0.0 | 0.0 |
| | Gellant/ETPA | 0.0 | 0.0 | 0.0 | 0.3 | 0.0 | 0.0 |
| | Gellant/PAOPA HP5** | 0.0 | 0.0 | 0.0 | 0.0 | 0.3 | 0.0 |
| | Rheology agent | 0.0 | 0.2 | 0.0 | 0.0 | 0.0 | 0.7 |
| | Thixotropic agent | 0.6 | 0.6 | 0.6 | 0.6 | 0.6 | 0.6 |
| | Surfactant | 0.5 | 0.5 | 0.2 | 0.2 | 0.2 | 0.5 |
| Viscosity (Pa · s) | | 445 | 493 | 497 | 485 | 493 | 302 |
| Line width on mono-crystal silicon wafer after firing (Eff, %) | | 60 μm (19.04) | 61 μm (19.03) | 56 μm (19.00) | 54 μm (18.97) | 60 μm (19.02) | 76 μm (18.74) |
| Line width multi-crystal silicon wafer after firing | | 46 μm | 46 μm | 47 μm | 47 μm | 48 μm | 57 μm |

*Weight ratio of Ag powder/glass frit/inorganic additive was 89.8/1.4/0.1.
**Ts 93° C., Mw 19,000, CrystaSense ® HP5 from Croda International Plc.

Examples 8 and 9

Conductive paste was prepared in the same manner as Example 2 except for the paste composition as shown in Table 4.

The conductive paste was screen printed in AMI printer using a screen design 40 μm opening and 100 finger lines. The paste was printed in 200 mm/sec printing speed and 300 mm/sec flood speed. Pastes were printed on a multi-crystal silicon wafer in order to evaluate line dimension on different Si wafer type and efficiency. The printed paste was subsequently dried and fired as well as Example 2.

Finger line dimension after firing was measured in the same manner as Example 2 and shown in Table 4.

TABLE 4

| | | (parts by weight) | |
|---|---|---|---|
| | | Example 8 | Example 9 |
| Composition | Inorganic powder* | 100 | 100 |
| | Polymer | 0.1 | 0.1 |
| | Solvent | 6.9 | 6.6 |
| | Gellant/PAOPA MP | 0.3 | 0 |
| | Gellant/PEPA HP4** | 0 | 0.3 |
| | Thixotropic agent | 0.6 | 0.6 |
| | Surfactant | 0.5 | 0.2 |
| Viscosity | | 436 Pa · s | 395 Pa · s |
| Line width after firing | | 41 μm | 44 μm |

*Weight ratio of Ag powder/glass frit/inorganic additive was 89.8/1.4/0.1.
**Ts 105° C., Mw 9,500, CrystaSense ® HP4 from Croda International Plc.

What is claimed is:

1. A method of manufacturing an electrical device, the method comprising:
   preparing a substrate;
   applying a conductive paste onto the substrate, wherein the conductive paste comprises (i) an inorganic powder comprising at least a conductive powder, (ii) an organic polymer, (iii) a solvent and (iv) a gellant selected from the group consisting of a polyalkyleneoxy terminated polyamide (PAOPA), an ester terminated polyamide (ETPA), polyether polyamine (PEPA) and a mixture thereof, wherein the gellant is 0.05 to 15 wt % based on the weight of the conductive paste; and
   heating the applied conductive paste to form an electrode.

2. The method of claim 1, wherein the substrate is ceramic substrate, glass substrate, polymer film substrate or semiconductor substrate.

3. The method of claim 1, wherein the inorganic powder further comprises a glass frit.

4. The method of claim 1, wherein weight ratio of the solvent and the gellant (solvent:gellant) is 10:1 to 50:1.

5. The method of claim 1, wherein softening point of the gellant is 70 to 120° C.

6. The method of claim 1, wherein molecular weight (Mw) of the gellant is 1,000 to 100,000.

7. The method of claim 1, wherein viscosity of the conductive paste is 330 to 550 Pa·s at 25° C.

8. The method of claim 1, wherein width of the electrode is 10 to 45 µm.

9. The method of claim 1, wherein the electrical device is a solar cell.

10. The method of claim 9, wherein the solar cell comprises a semiconductor substrate having at least one passivation layer on a light receiving side thereof.

11. The method of claim 10, wherein the conductive paste is applied on the passivation layer on a light receiving side and the conductive paste penetrates the passivation layer during heating.

12. A conductive paste comprising:
   (i) an inorganic powder comprising at least a conductive powder;
   (ii) an organic polymer;
   (iii) a solvent; and
   (iv) a gellant selected from the group consisting of a polyalkyleneoxy terminated polyamide (PAOPA), ester terminated polyamide (ETPA), polyether polyamine (PEPA) and a mixture thereof, wherein the gellant is 0.05 to 15 wt % based on the weight of the conductive paste.

13. The conductive paste of claim 12, wherein the inorganic powder comprises one or more glass frits.

14. The conductive paste of claim 12, where softening point of the gellant is 70 to 120° C.

15. The conductive paste of claim 12, wherein molecular weight (Mw) of the gellant is 1,000 to 100,000.

16. The conductive paste of claim 12, wherein weight ratio of the solvent and the gellant (solvent:gellant) is 10:1 to 50:1.

17. The conductive paste of claim 12, wherein the gellant is 0.05 to 20 parts by weight when the inorganic powder is 100 parts by weight.

18. The conductive paste of claim 12, wherein the additive comprises a thixotropic agent.

19. A conductive paste comprising:
   (i) an inorganic powder comprising at least a conductive powder;
   (ii) an organic polymer;
   (iii) a solvent; and
   (iv) a gellant having a molecular weight of 1,000 to 100,000.

* * * * *